(12) United States Patent
Citver et al.

(10) Patent No.: US 9,514,916 B2
(45) Date of Patent: Dec. 6, 2016

(54) WAFER PLATEN THERMOSYPHON COOLING SYSTEM

(71) Applicant: Varian Semiconductor Equipment Associates, Inc., Gloucester, MA (US)

(72) Inventors: Gregory Citver, Danvers, MA (US); Roger B. Fish, Beford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 709 days.

(21) Appl. No.: 13/835,317

(22) Filed: Mar. 15, 2013

(65) Prior Publication Data

US 2014/0262157 A1   Sep. 18, 2014

(51) Int. Cl.
*F28D 15/00*   (2006.01)
*H01J 37/317*   (2006.01)

(52) U.S. Cl.
CPC .... *H01J 37/3171* (2013.01); *H01J 2237/2001* (2013.01)

(58) Field of Classification Search
CPC .. F28D 15/06; F28D 15/0233; F28D 15/0266; F28D 15/046; F28D 15/04; H01L 2933/0075; H01L 21/67005; H01L 21/673; H01L 21/67098
USPC ............... 165/104.21, 128–129, 132, 272; 324/750.03, 750.06, 750.08
See application file for complete search history.

(56) References Cited

U.S. PATENT DOCUMENTS

| | | | | |
|---|---|---|---|---|
| 3,176,882 A * | 4/1965 | Meermans | ............ | B64G 1/402 222/187 |
| 4,407,139 A * | 10/1983 | Ide | ........................ | F24F 11/0009 62/158 |
| 4,578,962 A * | 4/1986 | Dustmann | ................. | H01F 6/04 310/54 |
| 5,126,571 A * | 6/1992 | Sakai | ................... | H01J 37/3171 250/442.11 |
| 5,132,545 A * | 7/1992 | Shono | ................... | H01J 37/302 250/398 |
| 5,516,732 A * | 5/1996 | Flegal | ................ | H01L 21/67167 29/25.01 |
| 6,023,935 A * | 2/2000 | Okazaki | ................... | F25B 25/00 62/119 |
| 6,196,005 B1 * | 3/2001 | Stautner | ................... | F17C 3/085 62/6 |
| 6,458,316 B1 * | 10/2002 | Garrett | ................... | B22F 3/1125 419/2 |
| 7,935,450 B2 * | 5/2011 | Preidel | .............. | H01M 8/04007 174/125.1 |

(Continued)

*Primary Examiner* — Etsub Berhanu
*Assistant Examiner* — Jose O Class-Quinones

(57) ABSTRACT

Disclosed is a thermosyphon system for cooling a platen in an ion implantation system. The thermosyphon system may include a vacuum chamber housing at least one wafer platen and a phase separator tank operative to contain both a liquid and gas phases of an element. A re-condensing cold head is exposed within the phase separator tank and is operative to condense the element from its gas phase to its liquid phase. This creates a convection driven closed loop pipe configuration. The closed loop pipe configuration includes a liquid phase pipe to carry the lower temperature liquid phase from the phase separator tank to the platen in the vacuum chamber. A reaction with the warmer platen converts the liquid phase to the gas phase. A gas phase pipe carries the higher temperature gas phase from the platen in the vacuum chamber back to the phase separator tank.

18 Claims, 4 Drawing Sheets

(56) References Cited

U.S. PATENT DOCUMENTS

| | | | |
|---|---|---|---|
| 2008/0044938 A1* | 2/2008 | England | H01L 21/26593 438/51 |
| 2008/0076194 A1* | 3/2008 | Blake | H01J 37/3171 438/5 |
| 2008/0090392 A1* | 4/2008 | Singh | H01J 37/32412 438/514 |
| 2008/0121821 A1* | 5/2008 | Muka | C23C 14/48 250/492.21 |
| 2010/0181500 A1* | 7/2010 | Chang | C30B 31/22 250/492.21 |

* cited by examiner

WAFER PLATEN THERMOSYPHON COOLING SYSTEM

FIELD

Embodiments of the invention relate to the field of semiconductor device fabrication. More particularly, the present invention relates to a thermosyphon cooling system for cooling semiconductor wafers in a vacuum chamber associated with an ion implantation system.

BACKGROUND

Ion implantation is a process used to dope impurity ions into a semiconductor substrate to obtain desired device characteristics. An ion beam is directed from an ion source chamber toward a substrate. The depth of implantation into the substrate is based on the ion implant energy and the mass of the ions generated in the source chamber. One or more ion species may be implanted at different energy and dose levels to obtain desired device structures. In addition, the beam dose (the amount of ions implanted in the substrate) and the beam current (the uniformity of the ion beam) can be manipulated to provide a desired doping profile in the substrate. However, throughput of semiconductor devices is highly dependent on the delivered dose of the ion beam on the target substrate to produce the desired semiconductor device characteristics.

It has been found that a relatively low target substrate or wafer temperature during ion implantation reduces the required dose and consequently manufacturing throughput. In cryogenic processing, the substrate is typically cooled by reducing the temperature of the platen upon which the wafer is disposed in the range of between room temperature to about −100° C. Lower wafer temperatures increase the amount of amorphization caused when ions from a ribbon beam in an ion implanter hit the substrate (damage layer) thereby providing better process control.

One way to cool wafers for cryogenic processing is to use an integrated cooling system operative with ion implantation system which may typically utilize a closed loop Nitrogen gas that removes heat from the wafer process platen. Such gas cooling systems are complex and expensive due to the need for external low temperature chillers, gas compressors, and associated power systems, as well as vacuum insulated cryogenic plumbing outside and inside the vacuum chamber. It would reduce cost, system complexity, and increase reliability, if instead a thermosyphon system could be used to remove heat from the wafer process platen and/or pre-cooling platens, thereby obviating the need for some of the prior complex systems.

Generally, a thermosyphon is a system that transfers heat via natural convection in a fluid. The natural convection is driven by gravity with the colder, denser fluid flowing downward toward a location where heat is to be removed and the warmer, less dense fluid flows upward to pulling the heat away from such a location. Thus, thermosyphon systems connect an object to be cooled with a reservoir or device providing the cooling. Thermosyphon systems have a number of advantages. They are passive devices requiring no external pumping to provide fluid flow and heat transfer. This leads to simpler, more reliable systems. Since the thermal conductivity of most materials at cryogenic temperatures is quite low, thermosyphons can in many cases transfer heat more efficiently than solid conduction.

SUMMARY

In view of the foregoing, the embodiments disclosed and claimed herein are describe a system and method that provide a wafer platen cooling system utilizing a thermosyphon technique. In one embodiment, there is disclosed a thermosyphon system for cooling at least one wafer platen in an ion implantation system. The thermosyphon system may include a vacuum chamber housing at least one wafer platen and a phase separator tank operative to contain both a liquid and gas phases of an element. A re-condensing cold head is exposed within the phase separator tank and is operative to condense the element from its gas phase to its liquid phase. This creates a convection driven closed loop pipe configuration. The closed loop pipe configuration includes a liquid phase pipe operative to carry the lower temperature liquid phase of the element from the phase separator tank to the least one wafer platen in the vacuum chamber. An evaporation process occurs when the warmer wafer platen converts the liquid phase of the element to the gas phase of the element. A gas phase pipe is operative to carry the higher temperature gas phase of the element from the wafer platen in the vacuum chamber back to the phase separator tank.

In another embodiment, there is disclosed a method of cooling at least one wafer platen using a thermosyphon convection system. The method includes flowing a liquid phase of an element from a phase separator tank to at least one wafer platen contained in a vacuum chamber of the ion implantation system through a liquid phase pipe. The liquid phase of the element evaporates into a gas phase of the element due to the transition from the warmer wafer platen. The method then flows the gas phase of the element from the at least one wafer platen contained in the vacuum chamber back to the phase separator tank through a gas phase pipe. The method then re-condenses the gas phase of the element into its liquid phase using a re-condensing cold head within the phase separator tank.

DETAILED DESCRIPTION

Figure 1:
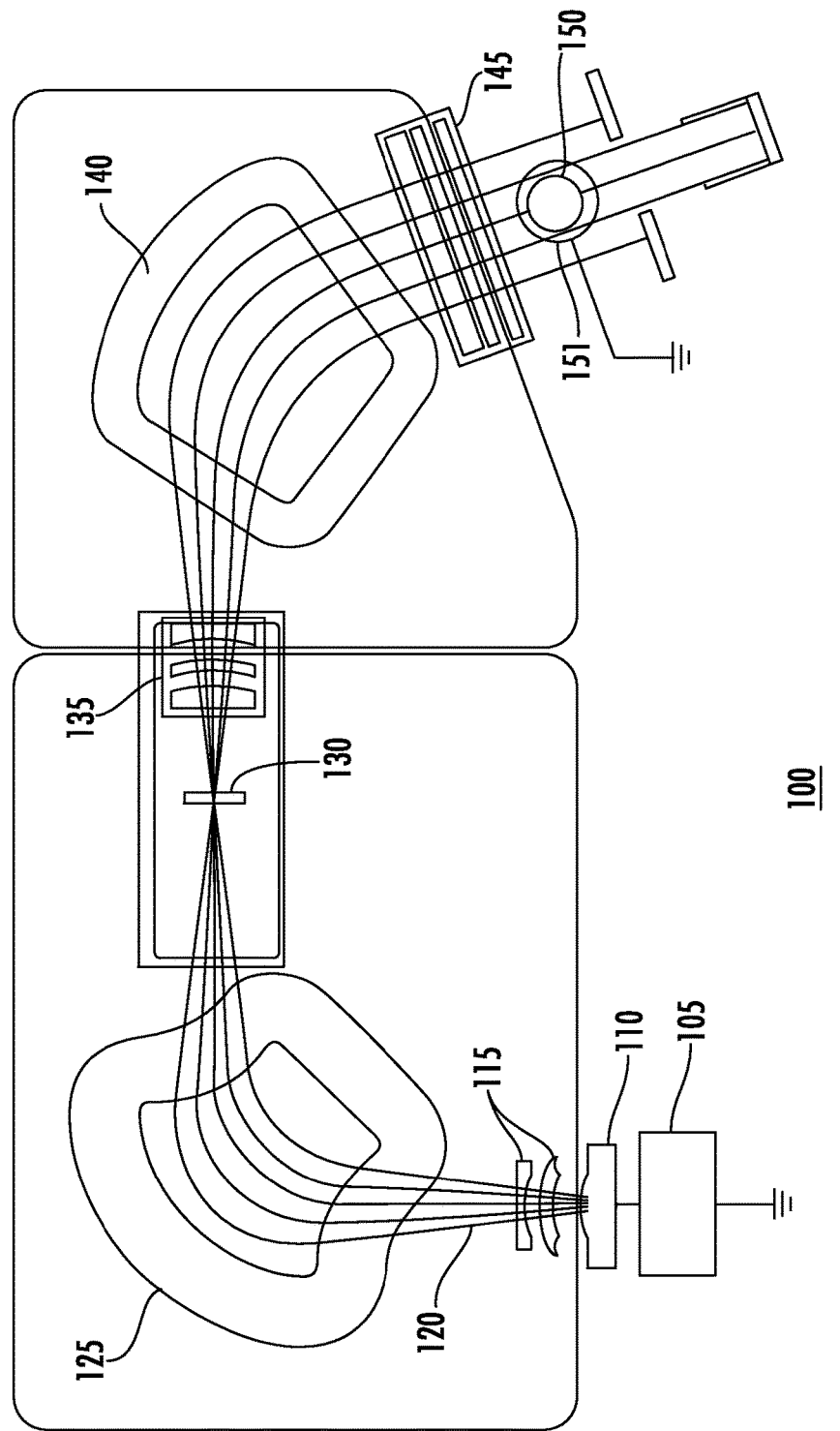
FIG. 1 is a block diagram of an example ion implanter system.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

In some embodiments, there is described a thermosyphon cooling system for the wafer platens of an ion implantation system. The thermosyphon cooling system may use a single phase fluid or, more commonly in cryogenic applications, a two-phase system in which liquid flows downward toward a target substrate to be cooled, and vapor flows back up to the a cold sink. Depending on the various applications, the thermosyphon system may comprise a single pipe or separate pipes for the cold and warm fluids. Thermosyphon systems applicable for cryogenics may use a variety of working fluids, including helium, nitrogen, argon or even neon. Increasingly, thermosyphon systems have incorporated small cryo-coolers to provide cooling at the cold reservoir end of the system.

To remove heat from a platen, a thermosyphon may connect an elevated re-condensing cold head and the surface to be cooled down (e.g., the wafer platen). Gas inside the thermosyphon will circulate due to buoyancy and provide heat transfer between warm surfaces (wafer platen) and cold surfaces (re-condensing cold head). For operation at 77 Kelvin (−196° C.) or warmer, liquid nitrogen (LN2) may be used as the cooling liquid. N2 vapor will condense at the 77K re-condensing cold head surface and LN2 will be available for cooling flow. This heat transfer mechanism is hundreds times more efficient than conduction through copper or circulating chilled gas only.

FIG. 1 is a block diagram of an exemplary ion implanter system 100 in which a technique for wafer platen cooling may be implemented in accordance with an embodiment of the present disclosure. As is typical for most ion implanter systems, the system 100 is housed in a high-vacuum environment. An RF plasma source generator 105 supplies the required energy to plasma chamber 110 which is configured to generate ions of a particular species. The generated ions are extracted from a source gas through a series of electrodes 115 and formed into a beam 120 which passes through mass analyzer magnet 125. The mass analyzer is configured with a particular magnetic field such that only the ions with a desired mass-to-charge ratio are able to travel through the analyzer for maximum transmission through the mass resolving slit 130. Ions of the desired species pass from mass slit 130 through deceleration stage 135 to corrector magnet 140. Corrector magnet 140 is energized to deflect ion beamlets in accordance with the strength and direction of the applied magnetic field to provide a ribbon beam targeted toward a work piece or substrate (e.g., a target wafer) 150 positioned on a platen 151. During ion implantation, the target wafer 150 is typically mounted on platen 151 that can be moved in one or more dimensions (e.g., translate, rotate, and tilt) by an apparatus, sometimes referred to as a "roplat." In some embodiments, a second deceleration stage 145 may be disposed between corrector magnet 140 and support 151. The ions lose energy when they collide with electrons and nuclei in the substrate and come to rest at a desired depth within the substrate based on the acceleration energy.

Figure 1A:
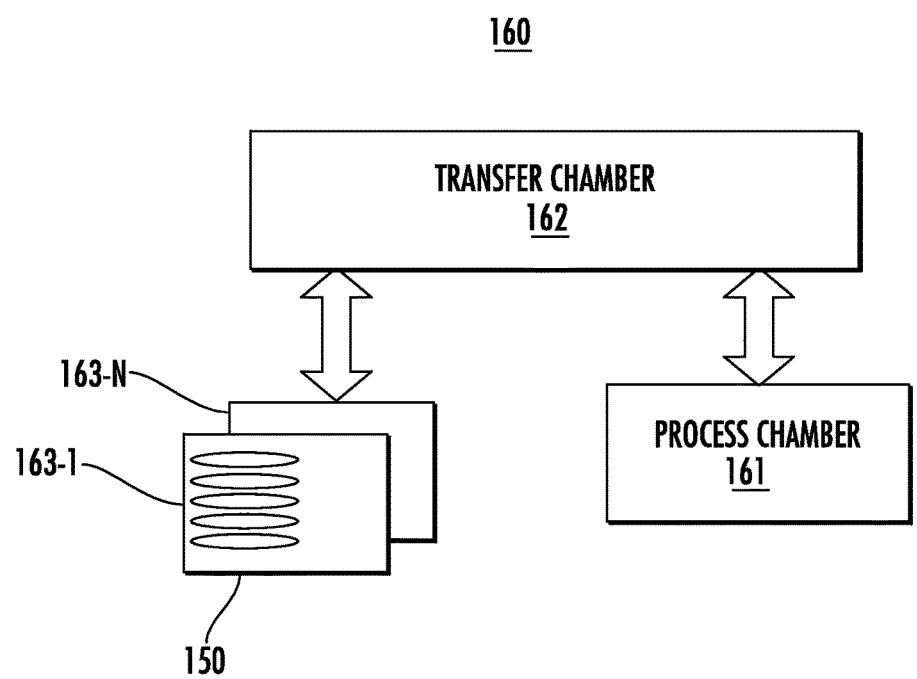
FIG. 1A is a functional block diagram of a vacuum processing system used in ion implanter system shown in FIG. 1.

FIG. 1A is a functional block diagram of a vacuum processing system 160 used in the fabrication of target substrates such as, for example, integrated circuits, flat panel displays, etc. The vacuum processing system 160 includes at least one processing chamber 161, transfer chamber 162 and one or more loadlock chambers 163-1 . . . 163-N. The process chamber 161 houses platen 151 (shown in FIG. 1) which receives a wafer or target substrate 150 for processing. A support may also be disposed under platen 151 and configured to receive the coolant from the thermosyphon system 200 (shown in FIG. 2) to reduce the temperature of the target substrate disposed on the platen 151 for cryogenic processing. Alternatively, the coolant from the thermosyphon system 200 may be provided directly to and through the platen 151 to cool target substrate 150 to a predetermined temperature range. Typically, a desired temperature range for low-temperature ion implantation is well below room temperature, and often below the freezing point of pure water. Although the thermosyphon system 200 is described herein utilizing liquid nitrogen to reduce the temperature of the target substrate 150 for cryogenic processing, such an extreme temperature may not be necessary or practicable for all ion implantations and alternative cooling agents may be employed.

The transfer chamber 162 is connected to the load locks 163-1 . . . 163-N and to process chamber 161. The transfer chamber 162 houses one or more substrate handling robots used to retrieve wafers or substrates 150 stored in loadlock chambers 163-1 . . . 163-N and transfers them to the process chamber 161. The pressure in the transfer chamber 162 is typically held at a constant vacuum while the process chamber 161 may be kept at a higher or lower vacuum depending on the desired implant process. Loadlock chambers 163-1 . . . 163-N can be configured to store multiple processed and unprocessed wafers or substrates 150. In particular, a loadlock chamber may include a plurality of cassettes which house the substrates or wafers. The substrates 150 may be stacked vertically within a cassette and are spaced apart sufficiently for the wafer handling robot arms to reach under a substrate or wafer to remove it from or place it a respective loadlock 163-1 . . . 163-N. Once all the wafers or substrates 150 within a loadlock cassette have been processed, the cassette is removed by a robot or operator and a new cassette of unprocessed wafers or substrates 150 is placed in a loadlock chamber 163-1 . . . 163-N for processing.

Figure 2:
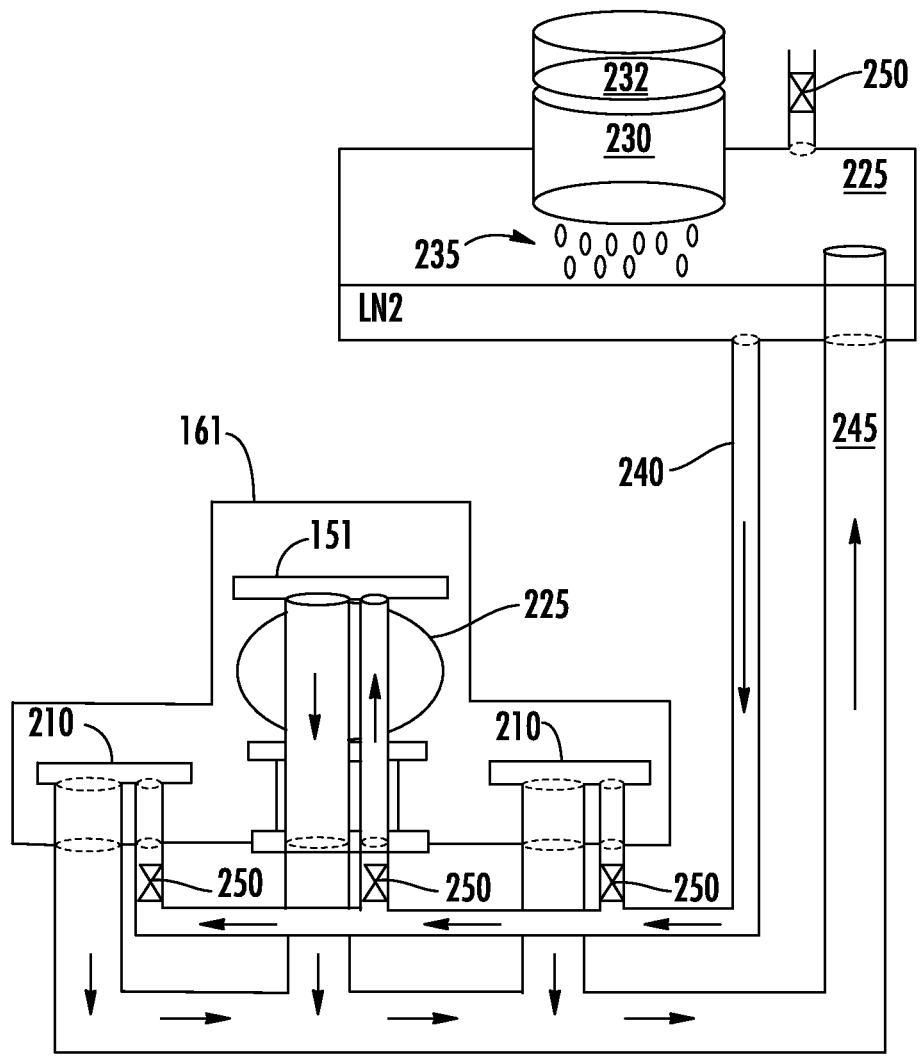
FIG. 2 is a block diagram of an embodiment of a thermosyphon wafer platen cooling system.

FIG. 2 is a block diagram of an exemplary embodiment of a thermosyphon wafer platen cooling system 200 used to reduce the temperature of a support or platen 151 within processing chamber 161 which, in turn, allows cryogenic processing of a target substrate 150 disposed on the platen 151. As mentioned briefly above, it has been found that a relatively low target substrate or wafer 150 temperature during ion implantation improves crystal amorphization as well as device damage layer uniformity. For cryogenic processing, the substrate 150 is typically cooled by reducing the temperature of the wafer platen 151 upon which the wafer or substrate is disposed in the range of between room temperature to about −100° C. Lower wafer temperatures increase the amount of damage, for a given dose, caused when ions from ribbon beam 120 hit the target substrate (damage layer) disposed on wafer platen 151. This increased damage layer improves recrystallization during annealing and allows manufacturers to create abrupt source-drain extensions and ultra-shallow junctions needed for today's semiconductor devices. When the temperature of the wafer or substrate 150 is decreased, the thickness of the amorphous silicon layer increases because of a reduction in the self-annealing effect. With a thicker amorphous layer, less tail channeling is produced. Damage created by beam ions is confined in the amorphous region and less damage is introduced into the crystalline region immediately beyond the amorphous-crystalline interface.

In addition to the benefits introduced by a thicker amorphous silicon layer, performing ion implantation at low temperatures also minimizes the movement of Frenkel pairs during implantation. As a result, fewer Frenkel pairs are pushed into the region beyond the amorphous-crystalline interface of the target substrate 150 as compared to the case of higher substrate temperature implantation. Most of the Frenkel pairs will grow back into the lattice during the solid-phase epitaxy process and do not contribute to excess interstitials which cause transient enhanced diffusion or form extended defects. With fewer interstitials pushing channel or halo dopants into a channel region, less negative coupling, such as reverse short channel effect, may be achieved. Thus, better process control and prediction of device performance is obtained by using cryogenic processing.

The thermosyphon wafer platen cooling system 200 operates on a closed loop convection principle in which gravity draws a cooler liquid element downward through a liquid phase pipe 240 and returns a gas phase of the element through a gas phase pipe 245 after phase state exchange has evaporated the liquid phase into a gas phase. In addition, the liquid phase pipe 240 may include one or more check valves 250 operative to control the cooling power delivered to the platens 151, 210 and to prevent the backflow of the liquid phase of the element thereby aiding the phase change by maintaining a liquid element presence through at least one wafer platen 150 and pre-processing platens 210. The phase change, namely evaporation from the liquid phase to the gas phase occurs at the platens 151, 210. The wafer platens 151, 210 may include a process wafer platen 151 and one or more pre-cooling wafer platens 210. The wafer platens 151, 210 are part of a larger ion implantation system such as the one described in FIGS. 1 and 1A above. The wafer platens 151, 210 and ion implantation scan system components 215 are contained within a vacuum processing chamber 161.

The thermosyphon wafer platen cooling system 200 further includes a phase separator tank 225. The phase separator tank 225 is designed to hold both the liquid and gas phases of an element such as nitrogen. A re-condensing cold head 230 is also present within the phase separator tank 225. The re-condensing cold head 230 is operative to condense the gas phase of the element back into the liquid phase of the element 235 so that it may be re-used in the closed loop convection piping configuration. The re-condensing cold head 230 may include a compressor 232 to help regulate the refrigeration capacity of the re-condensing cold head 230. For example, the temperature of the wafer platen(s) may be controlled by adjusting the flow of condensed liquid to the platen down the liquid phase pipe 240 via the check valve 250. In another embodiment, the temperature of the wafer platen(s) may be controlled by adjusting the refrigeration capacity of the re-condensing cold head to restrict the flow of the liquid element available to the liquid phase pipe 240.

The phase separator tank 225 and associated re-condensing cold head 230 are mounted above the wafer platens 151, 210. This is so that the convection process can occur where the object to be cooled (e.g., the wafer platens 151, 210) receives the liquid phase of the element due to gravity. The gas phase of the element resulting from the evaporation of the liquid is more buoyant and can 'flow' up the gas phase pipe 245 back to the phase separator tank 225.

In operation, the phase separator tank 225 contains an amount of an element in its liquid form such as liquid nitrogen (LN2). The phase separator tank 225 also includes an associated re-condensing cold head 230. The phase separator tank 225 has an opening at the bottom of the tank for the LN2 to flow out into a liquid phase pipe 240 according to gravity. The phase separator tank 225 also includes a second inlet gas phase pipe 245. The gas phase pipe 245 enters the phase separator tank 225 and continues upward toward the top of the phase separator tank 225 where N2 gas it is re-condensed into a liquid 235. The opening of the gas phase pipe 245 within the phase separator tank 225 should be above the fluid line in the phase separator tank 225 to avoid any backflow of LN2 into the gas phase pipe 245.

LN2 flows from the phase separator tank 225 through the liquid phase pipe 240 toward the wafer platens 151, 210 within the vacuum chamber 205 of the ion implantation system 100. Near each of the wafer platens 151, 210 within the liquid phase pipe 240 is a check valve 250 operative to allow the LN2 to flow towards the wafer platens 151, 210 but not back. This helps ensure that the LN2 is sufficiently close to the wafer platens 151, 210 to result in the evaporation exchange that occurs. The heat transfer reaction in which the LN2 cools the wafer platens 151, 210 and evaporates into N2 gas in the process may be referred to herein as an enthalpy reaction with the system. The N2 gas is significantly more buoyant and can 'flow' back to the phase separator tank 225 via the gas phase pipe 245 where it is re-condensed into a liquid 235. This creates a convection effect and allows more LN2 to flow. The gas phase of nitrogen (N2) has a significantly greater volume than the liquid phase (LN2). Thus, the gas phase pipe 245 must be able to accommodate the greater volume. In one embodiment, the gas phase pipe 245 is capable of handling a volume capacity that is at least 650 times greater than the liquid phase pipe 240.

In one embodiment, using an LN2 thermosyphon cooling system 200 to cool wafer platens 151, 210 in an ion implantation system 100 requires the phase separator tank 225 to deliver 0.073 liters of LN2 for each wafer via the liquid phase pipe 240. The heating of the LN2 will cause the evaporation of the LN2 into N2 gas with volume expansion as explained in more detail below.

The LN2 flows from the phase separator tank 225 to the wafer platens 151, 210 because of gravity. The wafer platens 151, 210 may be cooled down to a temperature of −100 Celsius according to the requirements of the ion implantation system 100. The desired temperature may be reached by metering the amount of LN2 through the liquid phase pipe 240. Two techniques for metering have been described above, namely varying the speed of the compressor 232 within the re-condensing cold head 230 and restricting the flow of LN2 through the liquid phase pipe 240. A room temperature wafer (e.g., 20 C) is delivered to a cold wafer platen 151, 210. The wafer is then cooled through a heat transfer process with the cold wafer platen 151, 210 that raises the temperature of the wafer platens 151, 210. Thus, the wafer platens 151, 210 need to be re-cooled so that they can maintain the wafer at the desired temperature or cool new wafers that are delivered to the wafer platens 151, 210.

In one such embodiment, a 300 mm silicon wafer is delivered to a wafer platen 151, 210. The heat capacity of such a silicon wafer is 0.794 J/g Celsius. The wafer volume may be 53.0 cm3 and its density may be 2.33 g/cm3 leading to a mass of 123.5 grams. The thermal capacity of the silicon wafer may be 123.5 g times its heat capacity of 0.794 J/g C which equals 98 J/C. The evaporation of liquid nitrogen (LN2) is 198.38 KJ/Kg at 1 atmosphere and 77 degrees Kelvin. The density of LN2 is 808.607 Kg/m3. In other units, the evaporation of LN2 may result in 160.4 KJ/l which can be restated as 160 J/ml. The specific volume for LN2 is 1.238 l/Kg and for N2 gas is 219.1 l/Kg (at 1 atm, 77 k).

To cool the 300 mm silicon wafer described above from 20 C down to −100 C using LN2 would require 11,760 Joules. This is calculated by multiplying the temperature difference of 120 C by the thermal capacity of the silicon wafer of 98 J/C. This results in an LN2 vaporization of 73.3 ml (11,760 J divided by 160.4 J/ml). N2 gas generation as a result is 73.3 ml times 0.8086 g/ml times 0.2191/g which equals 13 liters at 77 kelvin. When N2 gas expansion is factored in from 77 K to 293 K, the result is 13 times 3.7 or 48 liters. Thus, the total volume change from LN2 to N2 is approximately 650.

Figure 3:
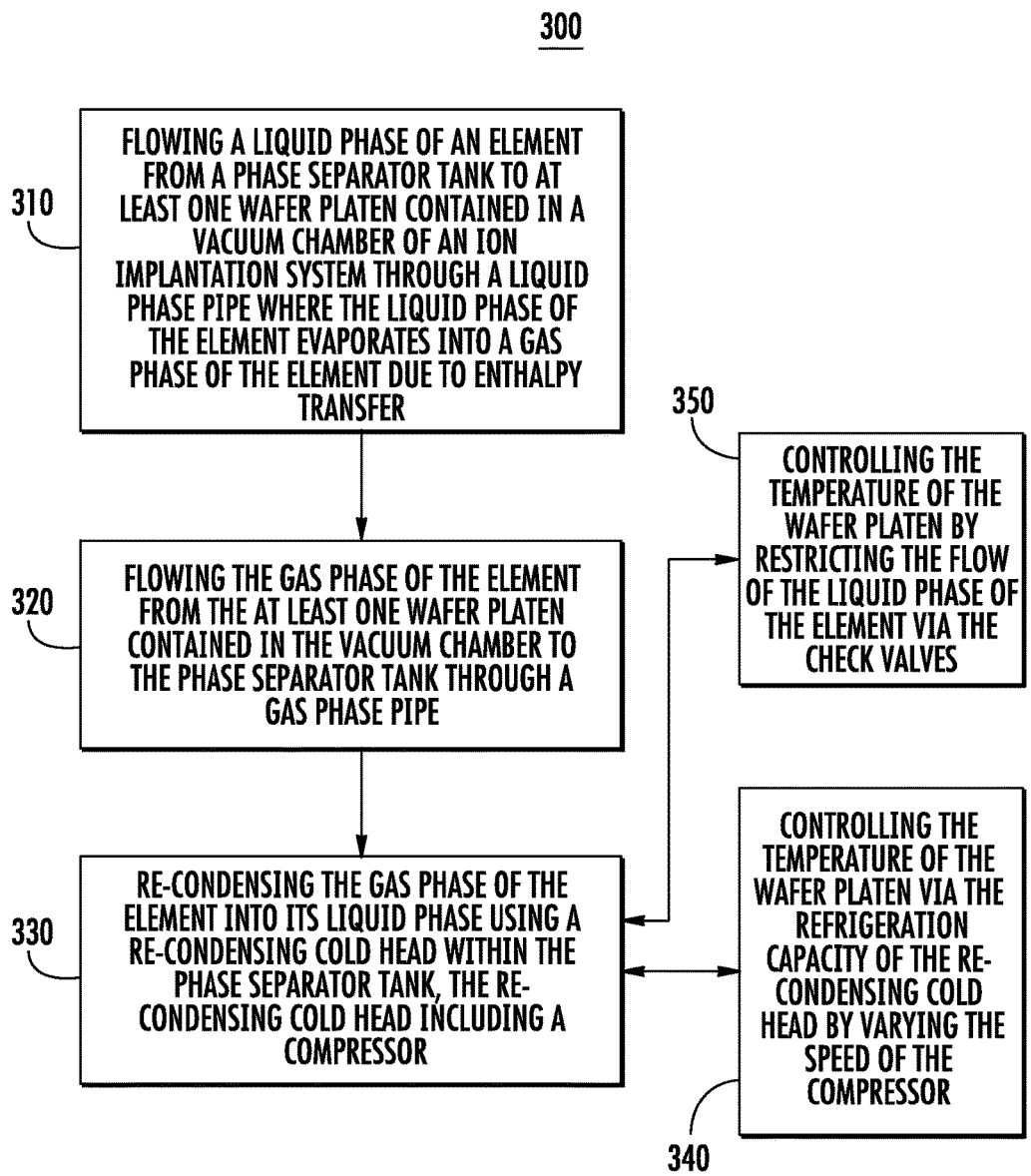
FIG. 3 illustrates one embodiment of a logic flow diagram.

FIG. 3 illustrates one embodiment of a logic flow 300. Logic flow 300 may be representative of the operations executed by one or more embodiments described herein. The logic flow 300 may provide a liquid phase of an element from a phase separator tank 225 to at least one wafer platen 151, 210 at block 310. For example, the wafer platen 151, 210 may be contained in a vacuum chamber 205 of an ion implantation system 100. The flow of the liquid phase of the element (e.g., liquid nitrogen) may occur through a liquid phase pipe 240 where the liquid phase of the element evaporates into a gas phase of the element (e.g., N2).

The logic flow 300 may flow the gas phase of the element (e.g., N2) from the at least one wafer platen 151, 210 contained in the vacuum chamber 205 back to the phase separator tank 225 through a gas phase pipe 245 at block 320. For example, the evaporated liquid resulting from enthalpy reaction may be carried back to the phase separator tank 225 via convection. The gas phase of the element occupies a significantly greater volume than the liquid phase of the element so the gas phase pipe 245 is designed to handle a greater volume capacity than the liquid phase pipe 240. In the case where the element is nitrogen, the gas phase pipe 245 should have a volume capacity of at least 180 times that of the liquid phase pipe 240 if the gas remains at 77K The logic flow 300 may re-condense the gas phase of the element into its liquid phase using a re-condensing cold head 230 within the phase separator tank 225 at block 330. For example, when the gas phase of the element returns to the phase separator tank 225, the re-condensing cold head 230 may condense the gas phase back to its liquid phase 235 where it may be recycled through the liquid phase pipe 240 to further cool the wafer platen(s) 151, 210.

The logic flow 300 will control the refrigeration capacity of the re-condensing cold head 230 by varying the speed of the compressor 232 at block 340. This capacity can be set as to balance the heat load from losses in the system and the heat exchanges with the wafer(s) 151, 210. In another embodiment, the logic flow 300 may control the refrigeration capacity of the re-condensing cold head 230 by restricting the flow of the liquid element to the liquid phase pipe 240 using check valves 250 at block 350.

The thermosyphon wafer platen cooling system 200 is more efficient than the prior art systems. The heat transfer using the thermosyphon wafer platen cooling system 200 is hundreds times more efficient than conduction systems through copper or circulating chilled gas only.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A thermosyphon system for cooling a substrate in an ion implantation system, the system comprising:
   a vacuum chamber housing a process wafer platen and a pre-cooling wafer platen;
   a phase separator tank operative to contain both a liquid and gas phases of an element;
   a re-condensing cold head exposed within the phase separator tank operative to condense the element from its gas phase to its liquid phase; and
   a convection driven closed loop pipe configuration comprising: a liquid phase pipe to carry the lower temperature liquid phase of the element from the phase separator tank to the process wafer platen and the pre-cooling wafer platen in the vacuum chamber where enthalpy converts the liquid phase of the element to the gas phase of the element, the liquid phase pipe further comprising a first liquid phase branch that abuts the process wafer platen, and a second liquid phase branch that abuts the pre-cooling wafer platen; and
   a gas phase pipe to carry the higher temperature gas phase of the element from the process wafer platen and the pre-cooling wafer platen in the vacuum chamber to the phase separator tank, the gas phase pipe further comprising a first gas phase branch that abuts the process wafer platen and a second gas phase branch that abuts the pre-cooling wafer platen, wherein the first liquid phase branch and the first gas phase branch are disposed on a same side of the process wafer platen, wherein the second liquid phase branch and the second gas phase branch are disposed on a same side of the pre-cooling wafer platen, and wherein the first liquid phase branch, the second liquid phase branch, the first gas phase branch, and second gas phase branch are disposed within the vacuum chamber.

2. The thermosyphon system of claim 1, the liquid phase pipe including at least one check valve.

3. The thermosyphon system of claim 1, the gas phase pipe having a volume capacity that is at least 650 times that of the liquid phase pipe.

4. The thermosyphon system of claim 1, the re-condensing cold head including a compressor wherein the temperature of the process wafer platen and the pre-cooling wafer platen is controllable by adjusting the refrigeration capacity of the re-condensing cold head by varying the speed of the compressor.

5. The thermosyphon system of claim 1, wherein the temperature of the process wafer platen and the pre-cooling wafer platen is controllable by restricting the flow of the liquid element to the liquid phase pipe.

6. The thermosyphon system of claim 1, the re-condensing cold head and the phase separator tank mounted above the vacuum chamber.

7. The thermosyphon system of claim 1, wherein the element is nitrogen.

8. The thermosyphon system of claim 1, wherein the element is helium.

9. The thermosyphon system of claim 1, wherein the element is argon.

10. The thermosyphon system of claim 1, wherein the element is neon.

11. A method of cooling a substrate using a thermosyphon convection system, the method comprising:
    flowing a liquid phase of an element from a phase separator tank to a process wafer platen and a pre-cooling wafer platen contained in a vacuum chamber of an ion implantation system through a liquid phase pipe where the liquid phase of the element evaporates into a gas phase of the element due to enthalpy, wherein the liquid phase pipe comprises a first liquid phase branch that abuts the process wafer platen and a second liquid phase branch that abuts the pre-cooling wafer platen;
    flowing the gas phase of the element from the process wafer platen and the pre-cooling wafer platen contained in the vacuum chamber to the phase separator tank through a gas phase pipe, wherein the gas phase pipe comprises a first gas phase branch that abuts the process wafer platen and a second gas phase branch that abuts the pre-cooling wafer platen, wherein the first liquid phase branch and the first gas phase branch are disposed on a same side of the process wafer platen, wherein the second liquid phase branch and the second gas phase branch are disposed on a same side of the pre-cooling wafer platen, and wherein the first liquid phase branch, the second liquid phase branch, the first gas phase branch, and second gas phase branch are disposed within the vacuum chamber; and re-condensing the gas phase of the element into its liquid phase using a re-condensing cold head within the phase separator tank, the re-condensing cold head including a compressor.

12. The method of claim 11, the liquid phase pipe including at least one check valve.

13. The method of claim 11, the gas phase pipe having a volume capacity that is at least 650 times that of the liquid phase pipe.

14. The method of claim 11, further comprising controlling the temperature of the process wafer platen and the pre-cooling wafer platen by adjusting the refrigeration capacity of the re-condensing cold head through varying the speed of the compressor.

15. The method of claim 11, further comprising controlling the temperature of the process wafer platen and the pre-cooling wafer platen by restricting the flow of the liquid element to the liquid phase pipe.

16. The method of claim 11, the re-condensing cold head and the phase separator tank mounted above the vacuum chamber.

17. The method of claim 11, wherein the element is nitrogen.

18. The method of claim 11, wherein the element is one of helium, argon, or neon.

* * * * *